(12) United States Patent
Wang et al.

(10) Patent No.: US 10,921,266 B2
(45) Date of Patent: Feb. 16, 2021

(54) IMAGING DEVICE, IMAGING METHOD, AND IMAGING SYSTEM

(71) Applicant: Nanjing University, Nanjing (CN)

(72) Inventors: Peng Wang, Nanjing (CN); Zhiyuan Ding, Nanjing (CN); Si Gao, Nanjing (CN); Biying Song, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 16/484,714

(22) PCT Filed: Sep. 28, 2018

(86) PCT No.: PCT/CN2018/108278
§ 371 (c)(1),
(2) Date: Aug. 8, 2019

(87) PCT Pub. No.: WO2019/072101
PCT Pub. Date: Apr. 18, 2019

(65) Prior Publication Data
US 2020/0003709 A1     Jan. 2, 2020

(30) Foreign Application Priority Data
Oct. 9, 2017 (CN) .......................... 2017 1 0928976

(51) Int. Cl.
*G01N 23/2055* (2018.01)
*G01N 23/04* (2018.01)
*G01N 23/20* (2018.01)

(52) U.S. Cl.
CPC .......... *G01N 23/2055* (2013.01); *G01N 23/04* (2013.01); *G01N 23/20075* (2013.01); *G21K 2207/005* (2013.01)

(58) Field of Classification Search
USPC ....................................................... 250/306
See application file for complete search history.

(56) References Cited

U.S. PATENT DOCUMENTS

| 4,099,055 A | 7/1978 | Todokoro |
| 4,743,756 A | 5/1988 | Krivanek |

(Continued)

FOREIGN PATENT DOCUMENTS

| CN | 102384922 A | 3/2012 |
| CN | 102629540 A | 8/2012 |

(Continued)

OTHER PUBLICATIONS

M.J. Humphry "Ptychographic electron microscopy using high-angle dark-field scattering for sub-nanometre resolution imaging", Nature Communications, Macmillan Publishers Limited, Mar. 2012, pp. 1-7 (Year: 2012).*

(Continued)

*Primary Examiner* — Phillip A Johnston

(57) ABSTRACT

The present invention discloses an imaging device, an imaging method, and an imaging system, belonging to the field of sample image data acquisition and imaging technology. The imaging device includes: a charged particle source, a convergence system, a scanning control system, a detection module, and a spectral analysis module disposed below the detection module, where the detection module includes a plurality of pixelated detector units; and the detection module is provided with a hole thereon. The diffraction pattern is obtained by using the detection module, and the spectral analysis module performs spectral analysis on a charged particle beam passing through the hole, so as to obtain the diffraction pattern and spectral signal simultaneously by one scanning. The imaging method of the present invention is based on a hollow ptychography method, which enables toper form imaging on the diffraction pattern obtained through the detection module, with good imaging effects.

12 Claims, 16 Drawing Sheets

(56) References Cited

U.S. PATENT DOCUMENTS

| | | | |
|---|---|---|---|
| 5,264,912 A | 11/1993 | Vaught et al. | |
| 7,576,325 B2* | 8/2009 | Gohara | H01J 37/222 |
| | | | 250/306 |
| 8,334,512 B2* | 12/2012 | Luecken | H01J 37/26 |
| | | | 250/311 |
| 8,436,301 B2* | 5/2013 | Terada | H01J 37/153 |
| | | | 250/310 |
| 8,748,819 B2* | 6/2014 | Benner | H01J 37/04 |
| | | | 250/311 |
| 9,891,584 B2* | 2/2018 | Zhang | G03F 1/84 |
| 9,959,639 B2* | 5/2018 | Bosch | G06T 11/003 |
| 2015/0055745 A1 | 2/2015 | Holzner et al. | |
| 2016/0189922 A1 | 6/2016 | Kooijman et al. | |

FOREIGN PATENT DOCUMENTS

| | | |
|---|---|---|
| CN | 102737933 A | 10/2012 |
| CN | 103838124 A | 6/2014 |
| CN | 105575749 A | 5/2016 |
| CN | 106257323 A | 12/2016 |
| CN | 107796837 A | 3/2018 |

OTHER PUBLICATIONS

1st Office Action from Chinese Patent Office dated Apr. 30, 2019 in related Application # CN 201710928976.9.
International Search Report dated Dec. 28, 2018 for PCT Application No. PCT/CN2018/108278.

* cited by examiner

IMAGING DEVICE, IMAGING METHOD, AND IMAGING SYSTEM

This application is a National Phase of International Application No. PCT/CN2018/108278 filed on Sep. 28, 2018, which claims priority to and the benefit of Chinese Patent Application No. 201710928976.9, filed on Oct. 9, 2017, the disclosures of which are incorporated herein by reference in their entirety.

TECHNICAL FIELD

The present invention belongs to the field of sample image data acquisition and imaging technology, and in particular, relates to an imaging device, an imaging method, and an imaging system.

BACKGROUND ART

In a conventional transmission electron microscope (CTEM), parallel electron beams, not converged electron beams, are incident onto a sample. Usually, a CCD is used as a detector, and signals of an electron on each pixel point throughout the CCD may be collected at a time. A CCD is utilized to perform imaging so as to obtain a transmission electron diffraction pattern, as described in Chinese patent CN105575749A. A scanning transmission electron microscope (STEM) is a device that converges electron beams accelerated by particular energy so that a convergence point of the electron beams is on the sample; controls the electron beams to scan the sample; collects an electron beam signal penetrating the sample by using a detector; and then, performs imaging. Compared with CTEM, STEM is more widely applied to a variety of subjects such as physics, chemistry, material science, and biology due to its high resolution and ability to be mounted with other additional apparatuses. For a modern scanning transmission electron microscope, for example, U.S. Pat. No. 4,099,055A describes a system, in which a beam of electrons is constrained and focused by a convergence system and scans a sample under the control of a scanning system, and a bright-filed or dark-field signal penetrating the sample is received by using a detector. With a particular microscope design, it is possible to obtain different signals such as both bright-field signal and dark-field signals simultaneously, and obtain a plurality of images by one scanning.

A current commercial scanning transmission electron microscope is a highly integrated and complex system that may usually include many other additional apparatuses, for example, various spectral analysis devices, which typically have electron energy loss energy spectra. For example, as described in U.S. Pat. Nos. 4,743,756A and 8,334,512, information such as ingredients and chemical states of a sample is usually measured by differentiating electrons of different energy losses in each scanning point. Therefore, performing spectral analysis is of great significance in sample analysis.

In the current commercial scanning transmission electron microscope, a set of annular detectors are usually used to detect scattered electrons of different collection angles so as to form images of different contrasts. If not used for imaging, then an electron beam is often used for characteristic spectrum analysis, for example, electron energy loss spectrum analysis and the like. HAADF (high angle annular dark field), ADF (annular dark field), ABF (annular bright field), BF (bright field), and the like are common techniques of using annular detectors. These methods have a difference in collection angles. Different collection angles enable the images to have different contrasts, for example, a heavy element is suitable for HADDF imaging. An advantage of the imaging method using the annular detector is fast imaging speed, but the characteristic spectrum analysis cannot be performed at the same time as the imaging in conventional transmission electron microscope (CTEM), and a plurality of types of electronic signals cannot be obtained simultaneously through the transmission electron microscope during an imaging process. Later, segmented annular detectors appear, for example, a segmented detector mentioned in U.S. Patent US2016254118A1, which is characterized in that an annular detector is split into a plurality of areas, and an independent signal may be obtained in each area. In DPC (differential phase contrast) and derived iDPC (integral differential phase contrast) technologies, the segmented annular detector is usually used, and the potential or the electric quantity of a sample is measured by using an asymmetric signal. Although it is possible to achieve the effect of obtaining a plurality of types of electronic signals simultaneously through the transmission electron microscope, the final effect of pixelation is not achieved, and a pixelated detector array is not implemented.

A pixelated detector array collects a signal of a pixel lattice mode, and subsequent processing is performed on the pixelated signal by, for example, imaging methods such as DPC, iDPC, HAADF, ADF, ABF, and BF.

In summary, it is significant to study how to obtain diffraction patterns and spectral signals simultaneously by one scanning and achieve an efficacy of pixelating the detection module in the process of obtaining the diffraction pattern.

A ptychographic imaging method is an imaging method based on scanning coherent diffraction, which is the imaging means combined with a phase retrieval algorithm. Compared with a conventional transmission scanning imaging method, the method does not require conventional objective lens, so that defects such as aberration may be avoided. In addition, this has been confirmed in different wavelength conditions such as for visible light, an x-ray, and an electron microscope. Results show obvious advantages in imaging quality and imaging resolution. Ptychography uses a device to obtain at least one diffraction pattern for reconstructing a target image of the sample. The whole process mainly relates to the reconstruction of a phase. A ptychography iteration engine (PIE) uses an algorithm for obtaining a reconstructed image by moving a probe function. An enhanced ptychography iteration engine (ePIE) may be used to obtain an initially unknown probe function in an iteration process and shares a common technical basis with ptychography. It can be seen that ptychography needs to be performed on the basis of obtaining the diffraction patterns, and a result of ptychography is obtained through mathematical processing of the diffraction patterns in a scanning process.

In summary, in a current scanning transmission electron microscope, there is no device capable of simultaneously obtaining diffraction patterns of converged electrons and performing spectral analysis. Even though a device for realizing the above functions is obtained by study, with the ptychography method in the prior art or derived ptychography iteration engine and enhanced ptychography iteration engine methods and the like, how to perform ptychography on the diffraction patterns obtained by the device remains problematic.

Therefore, how to improve an existing ptychography method so as to be adapted to various scanning transmission electron microscope devices is very important.

SUMMARY

Objectives of the present invention: In order to overcome disadvantages existing in the prior art that diffraction patterns and spectral data cannot be obtained by an existing scanning transmission electron microscope simultaneously and imaging cannot be performed for the device by using methods such as ptychography in the prior art, the present invention provides: an imaging device, which can obtain diffraction patterns and spectral signals simultaneously by one scanning, thereby improving the efficiency of acquiring data; and an imaging method, which is capable of performing ptychography for a special imaging device, with high imaging resolution and good image quality.

Technical solutions: In order to achieve the above objectives, an imaging device of the present invention is provided, including: a charged particle source, configured to emit charged particles;

a convergence system, configured to constrain and converge a charged particle beam;

a scanning control system, configured to control scanning of the charged particle beam on a sample;

a sample;

a detection module, configured to receive the charged particle and detect the signal strength of the charged particle; and a spectral analysis module disposed below the detection module, configured to analyze spectroscopic characteristics of the charged particle, where the detection module includes a plurality of pixelated detector units and the detection module is provided with a hole thereon.

In an imaging process of the imaging device, a charged particle beam is first emitted by the charged particle source; the charged particle beam enters the convergence system for convergence; the converged charged particle beam scans the sample; the charged particle beam is controlled by the scanning control system to scan the sample; a particular area on the sample is irradiated and scanned; the charged particle beam on each scanning point may penetrate or partly penetrate the sample in the process of scanning; the charged particle beams penetrating the sample enter the detection module; one portion of the charged particle beams is received by the detection module, and the other portion of the charged particle beams passes through the hole on the detection module and enters the spectral analysis module; the charged particle beams received by the detection module can be detected by the detection module so as to give the signal strength in a plurality of spatial positions within a scanning range of the sample at a time; and the charged particle beams entering the spectral analysis module obtain spectral data or energy loss spectra by using the spectral analysis module. At least one diffraction pattern is obtained by using the detection module having the hole, and spectral analysis is performed by using the charged particle beam passing through the hole. By simultaneously obtaining the diffraction (scattering) patterns and spectral signals by one scanning, the efficiency of acquiring data may be improved.

Further, the hole includes, but is not limited to, being of a circular shape, a square shape, or an annular shape.

Further, the detection module includes, but is not limited to, being of a square shape, a circular shape, and an island shape.

An imaging method of the present invention is provided, including the following steps:

acquiring at least one diffraction pattern; and performing ptychography on the acquired at least one diffraction pattern by using a hollow ptychography method, where the at least one diffraction pattern is obtained first by using detection module provided with a hole, and then, the at least one diffraction pattern is processed by using the hollow ptychography method, so that a ptychography reconstructed image is obtained.

Further, the method for acquiring at least one diffraction pattern is based on a set of imaging devices, the imaging device including: a charged particle source, a convergence system, a scanning control system, a sample, and a detection module, where the detection module includes a plurality of pixelated detector units and the detection module is provided with a hole thereon;

the method including the following steps:

A: converging, onto the sample by the convergence system, a charged particle beam emitted by the charged particle source;

B: controlling, by the scanning control system, the charged particle beam to scan the sample;

C: the charged particle beam penetrating the sample to arrive at the detection module, detecting the signal strength of a charged particle in a corresponding scanning position by the pixelated detector unit in the detection module, and acquiring a diffraction pattern in the corresponding scanning position; and D: the charged particle beam scanning the sample (4) with a partial overlap of probe positions.

Wherein the partial overlap of probe positions comprises, but not limited to, when the charged particle beam scans the surface of the sample (4), enabling a non-empty set $R_{overlap}$ to be present between a scanning area $R_i$ corresponding to a scanning beam spot and other scanning areas $R_j$, where $R_{overlap}=R_i \cap R_j$ (i≤N, j≤N), and N is the total number of scanning areas of the charged particle beam on the surface of the sample.

That is to say, a scanning area in which each diffraction pattern is generated is required to overlap with one or more other scanning areas in which at least one diffraction pattern is generated, thereby further ensuring that a finally obtained diffraction pattern is not absent.

Further, the performing ptychography on the acquired at least one diffraction pattern by using a hollow ptychography method particularly includes the following steps:

a: setting P(r) as a probe function and O(r) as a complex amplitude distribution function of an object, reconstructing O(r) through a plurality of iterative calculations, using O(r), which is reconstructed through a final iterative calculation, as a final complex amplitude distribution function of the object, and reconstructing an image through ptychography based on the final complex amplitude distribution function of the object;

b: setting $\Psi_{n,m}$ as a function of an exit wave penetrating the object, and defining $\Psi_{n,m}$ as a product of the probe function P(r) and the complex amplitude distribution function O(r) of the object:

$$\Psi_{n,m}(r)=P(r)\cdot O_n(r+R_m) \quad \text{formula (1), where}$$

n represents the $n^{th}$ iteration of O(r), m represents the $m^{th}$ scanning position of the charged particle beam on the sample, $R_m$ represents a relative coordinate vector of the charged particle beam in the $m^{th}$ scanning position on the sample relative to a first scanning position, and r is a space coordinate;

c: obtaining amplitude and phase distributions of the exit wave function $\Psi_{n,m}$ in a far field by performing Fourier transform on the function $\Psi_{n,m}$ of the exit wave penetrating the object, to obtain $$\Psi_{n,m}'(r) = \text{FFT}\{\Psi_{n,m}(r)\} = |A_{n,m}|\exp(i\Phi_{n,m}) \quad \text{formula (2), where}$$

$|A_{n,m}|$ represents an amplitude of the exit wave function $\Psi_{n,m}$ in a far field; and $\Phi_{n,m}$ represents a phase of the exit wave function $\Psi_{n,m}$ in the far field;

d: collecting, by using an experimental device, a far-field light intensity of an exit wave penetrating the sample, and recording the same as $I_m$, where $I_m$ in represents the far-field light intensity of the exit wave penetrating the sample after the charged particle beam scans the $m^{th}$ scanning position on the sample;

e: setting a constraint function M;

f: substituting $\sqrt{I_m}$ for the amplitude $|A_{n,m}|$ of the exit wave function $\Psi_{n,m}$ in the far field and substituting into the constraint function M so as to obtain formula (3):

$$\Psi_{n,m,new}'(r) = \sqrt{I_m}\exp(i\Phi_{n,m}) \times M + |A_{n,m}|\exp(i\Phi_{n,m}) \times (1-M) \quad \text{formula (3)}$$

g: obtaining a new exit wave function $\Psi_{n,m,new}(r)$ by performing inverse Fast Fourier transform on $\Psi_{n,m,new}'(r)$, which is shown by formula (4):

$$\Psi_{n,m,new}(r) = \text{FFT}^{-1}\{\Psi_{n,m,new}'(r)\} \quad \text{formula (4)}$$

h: obtaining, through calculation, a new complex amplitude distribution function of the object according to the new exit wave function $\Psi_{n,m,new}(r)$, which is shown by formula (5), $$O_{n+1}(r+R_m) = O_n(r+R_m) + \beta \frac{P(r)}{P(r)+\alpha} \times [\Psi_{n,m,new}(r) - \Psi_{n,m}(r)], \quad \text{formula (5)}$$

where $\alpha$ and $\beta$ are adjustable parameters, $\alpha$ is used to ensure that a denominator is not 0, and $\beta$ is used to control the strength fed back;

i: substituting the new complex amplitude distribution function $O_{n+1}(r+R_m)$ of the object into the formula (1) to start another iterative calculation; and j: using a complex amplitude distribution function $O_z(r+R_m)$ of the object, which is obtained through a final iterative calculation, as the basis of reconstructing an image, and obtaining the reconstructed image by plotting amplitudes and phases of $O_{n+1}(r+R_m)$.

After the new complex amplitude distribution function of the object is obtained through calculation via formula (1) to formula (5), the new complex amplitude distribution function $O_{n+1}(r+R_m)$ of the object is re-substituted into the formula (1) to start another iterative calculation, the complex amplitude distribution function $O_z(r+R_m)$ of the object, which is obtained through a final iterative calculation, is used as the basis of reconstructing an image, and the reconstructed image is obtained by plotting amplitudes and phases of $O_{n+1}(r+R_m)$.

Further, the constraint function M is related to a structure of the detection module. In discretized conditions, the constraint function M is represented by a matrix, each element value in the matrix corresponds to a dependent variable, a function value of the dependent variable is 1 or 0 (but not limited to 1 or 0), and an independent variable is a corresponding two-dimensional position coordinate.

Further, in the first iteration of O(r), a complex amplitude distribution function $O_0(r+R_m)$ of the object is set as a random distribution function.

An imaging system of the present invention is provided, including an imaging device and an imaging method.

Beneficial Effects:

Compared with the Prior Art, the Present Invention has the Following Advantages:

1. The imaging device of the present invention includes the detection module having the hole and the spectral analysis module. At least one diffraction pattern is obtained by using the detection module having the hole, and the spectral analysis module performs spectral analysis on a charged particle beam passing through the hole, so as to obtain the diffraction patterns and spectral signals simultaneously by one scanning.

2. In the imaging device of the present invention, the detection module is formed by arrangement and combination of a plurality of pixelated detector units. The pixelated detector unit can obtain the signal strength of a charged particle in a particular position, thereby acquiring the diffraction pattern. The acquired diffraction pattern is of high precision.

3. The imaging method of the present invention is based on a hollow ptychography method, which enables to perform imaging on the at least one diffraction pattern obtained by the detection module having the hole, with good imaging effects.

4. The imaging method of the present invention is applicable to an imaging device having a hole. The shape for the hole of the detection module having the hole is not limited to a circular shape, a square shape, an annular shape, etc. In addition, in terms of the effect of imaging, compared with the imaging obtained by a conventional imaging method being matched with a conventional imaging device, the resolution is higher and the image quality is higher as well.

5. The imaging method of the present invention is applicable to an imaging device having a hole. With a function M corresponding to the imaging device having the hole, imaging may be performed on diffraction pattern obtained by detection modules of all structures and shapes.

6. The present invention uses phase contrast imaging as a final imaging result. Phase contrast is more advantageous in the field of light element imaging, and the effect of imaging is better.

DESCRIPTION OF REFERENCE NUMERALS

1. Charged particle source; 2. Convergence system; 3. Scanning control system; 4. Sample; 5. Detection module; 6. Spectral analysis module; 7. Pixelated detector unit; 8. Hole.

DETAILED DESCRIPTION

The present invention is further described below with reference to the accompanying drawings and examples.

Example 1

Figure 1:
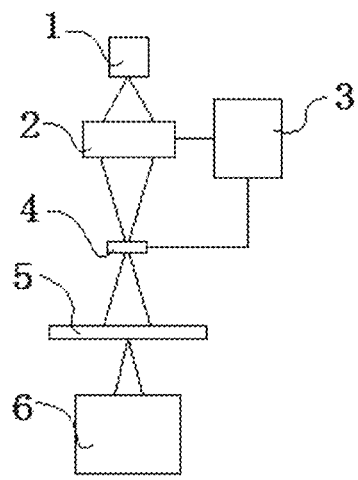
FIG. 1 is a schematic structural diagram of an imaging device of the present invention.

Referring to FIG. 1, an imaging device of this example includes a charged particle source 1, a convergence system 2, a scanning control system 3, a sample 4, a detection module 5, and a spectral analysis module 6 disposed below the detection module 5.

Figure 2:
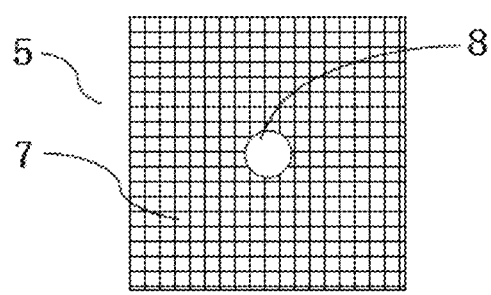
FIG. 2 is a schematic structural diagram of a detection module of the present invention.

The charged particle source 1 is configured to emit a charged particle; the convergence system 2 is configured to constrain and converge a charged particle beam; the scanning control system 3 is configured to control the charged particle beam to scan the sample, and the manner of scanning includes, but is not limited to, moving the charged particle beam or moving the sample; the detection module 5 is configured to receive the charged particle and detect the signal strength of the charged particle; and the spectral analysis module 6 disposed below the detection module 5 is configured to analyze spectroscopic characteristics of the charged particle. Referring to FIG. 2, the detection module 5 of this example includes a plurality of pixelated detector units 7, the plurality of pixelated detector units 7 are arranged and combined into the detection module 5, the manner of arrangement of the plurality of pixelated detector units 7 includes, but is not limited to, a square distribution, a circular distribution, or an island-shaped distribution, and each of the pixelated detector units 7 may give the signal strength of a charged particle in a particular spatial position. A hole 8 is disposed on the detection module 5, and the hole 8 is used for a charged particle beam that arrives at the detection module 5 to pass through and enter the spectral analysis module 6 below. When the charged particle beam irradiates on the detection module 5, it needs to be ensured that a portion of the charged particle beam passes through a position of the hole 8 and arrives at the spectral analysis module 6 below.

In an imaging process of the imaging device, a charged particle beam is emitted by the charged particle source 1 first; the charged particle beam enters the convergence system 2 for convergence; the converged charged particle beam scans the sample 4; the charged particle beam is controlled by the scanning control system 3 to scan the sample 4; a particular area on the sample 4 is irradiated and scanned; the charged particle beam on each scanning point may penetrate or partly penetrate the sample 4 in the process of scanning; the charged particle beams penetrating the sample 4 enter the detection module 5; some of the charged particle beams are received by the detection module 5, and the other charged particle beams pass through the hole 8 on the detection module 5 and enter the spectral analysis module 6; the charged particle beams received by the detection module 5 can be detected by the detection module so as to give the signal strength in a plurality of spatial positions within a scanning range of the sample at a time; and the charged particle beams entering the spectral analysis module 6 are used to obtain spectral data, energy loss spectra, or the like by using the spectral analysis module.

The device of this example obtains diffraction patterns by using a detection module having a hole, and performs spectral analysis by using a charged particle beam passing through the hole, so as to obtain diffraction patterns and spectral signals simultaneously by one scanning, which may improve the efficiency of acquiring data.

Example 2

Based on Example 1, referring to FIG. 2, in an imaging device of this example, the hole 8 includes, but is not limited to, being of a circular shape, a square shape, or an annular shape. The convergence system 2 and the scanning control system 3 can precisely determine an area range irradiated by the charged particle beam on the sample, the size of the area range, and its relative position. It can be clear that diffraction pattern obtained by the detection module 5 and spectral data obtained by the spectral analysis module 6 every time the charged particle beam scans the sample are created when the charged particle beam penetrates a particular position and area on the sample. An irradiation range of the charged particle beam is defined as R (a set of coordinates of all points within an irradiation area relative to an origin), the obtained diffraction pattern is defined as D (D is a set of signal sizes (light intensities) obtained by each detector unit), and the obtained spectroscopic data is defined as S (obtained by the spectral analysis module 6). The imaging device obtains data information of (R, D, S) simultaneously in each scanning in the scanning process.

Example 3

An imaging method of this example includes a method for acquiring at least one diffraction pattern and a method for performing ptychography on the acquired at least one diffraction pattern by using a hollow ptychography method.

The method for acquiring at least one diffraction pattern is based on a set of imaging devices. Referring to FIG. 1 and FIG. 2, the imaging device includes a charged particle source 1, a convergence system 2, a scanning control system 3, a sample 4, and a detection module 5. The detection module 5 consists of a plurality of pixelated detector units 7, and a hole 8 is disposed on the detection module 5. The charged particle source 1 is configured to emit a charged particle; the convergence system 2 is configured to constrain and converge a charged particle beam; the scanning control system 3 is configured to control the charged particle beam to scan the sample, and the manner of scanning includes, but is not limited to, moving the charged particle beam or moving the sample; and the detection module 5 is configured to receive the charged particle and detect the signal strength of the charged particle. The detection module 5 of this example includes a plurality of pixelated detector units 7, and the plurality of pixelated detector units 7 are arranged and combined into the detection module 5, the manner of arrangement includes, but is not limited to, a square distribution, a circular distribution, or an island-shaped distribution, and each of the pixelated detector units 7 may give the signal strength of a charged particle in a particular spatial position.

Steps of the method are as follows: converging, by the convergence system 2, a charged particle beam emitted by the charged particle source 1 onto the sample 4; controlling, by the scanning control system 3, the charged particle beam to scan the sample 4; and the charged particle beam penetrating the sample to arrive at the detection module, detecting the signal strength of a charged particle in a corresponding scanning position by the pixelated detector unit 7 in the detection module 5, and acquiring a diffraction pattern in the corresponding scanning position by the detection module 5 provided with the hole 8. After the charged particle beam is controlled by the scanning control system 3 to scan the sample 4, the convergence system 2 and the scanning control system 3 can precisely determine an area range irradiated by the charged particle beam on the sample, the size of the area range, and its relative position. It can be clear that diffraction pattern obtained by the detection module 5 every time the charged particle beam scans the sample is created when the charged particle beam penetrates a particular position and area on the sample. An irradiation range of the charged particle beam is defined as R (a set of coordinates of all points within an irradiation area relative to an origin), and the obtained diffraction pattern is defined as D (D is a set of signal sizes (light intensities) obtained by each detector unit). The imaging device obtains data information of (R, D) simultaneously in each scanning in the scanning process. The diffraction pattern is based on the strength of the charged particle obtained by the detector unit in the detection module 5.

The charged particle beam scans the sample 4 and a set of diffraction pattern information of the sample is obtained. The information includes scanning position information and diffraction pattern information, such as $\{(R_1, D_1), (R_2, D_2) \ldots (R_N, D_N)\}$. There is a non-empty set $R_{overlap}$ between a scanning area $R_i$ of the charged particle beam on the sample 4 and one or more other scanning areas $R_j$, $R_{overlap} = R_i \cap R_j$ (i≤N, j≤N) and N is the total number of scanning areas of the charged particle beam on the sample 4. That is, a scanning area in which each diffraction pattern is generated is required to overlap with one or more other scanning areas in which at least one diffraction pattern is generated.

Example 4

Based on Example 3, an imaging method of this example relates to obtaining an image by processing the diffraction pattern obtained by the detection module 5 based on a hollow ptychography algorithm. With the imaging method, a phase contrast sample image may be obtained with the at least one diffraction pattern of the charged particle. Based on initial data of the at least one diffraction pattern and an initially speculated iterative process of an exit wave, amplitude and phase information of the exit wave is reconstructed.

Relationships between a phase, an amplitude, and imaging for the reconstruction are as follows:

A final result of the reconstruction is a function O(r), an independent variable of the function is a position coordinate, and the value of the function may be understood as a change amount of the amplitude and the phase of the charged particle beam when penetrating the sample in particular position coordinates. It may be agreed that an relative value of the change amount of the amplitude and the phase of the charged particle beam is converted into a different gray scale value, and a gray scale picture is obtained by using different amplitude and phase change amounts in different spatial coordinates, which can be understood as a reconstructed image. An image obtained with an amount of amplitude change in O(r) is referred to as an amplitude contrast image, and an image obtained with an amount of phase change is referred to as a phase contrast image.

Figure 3:
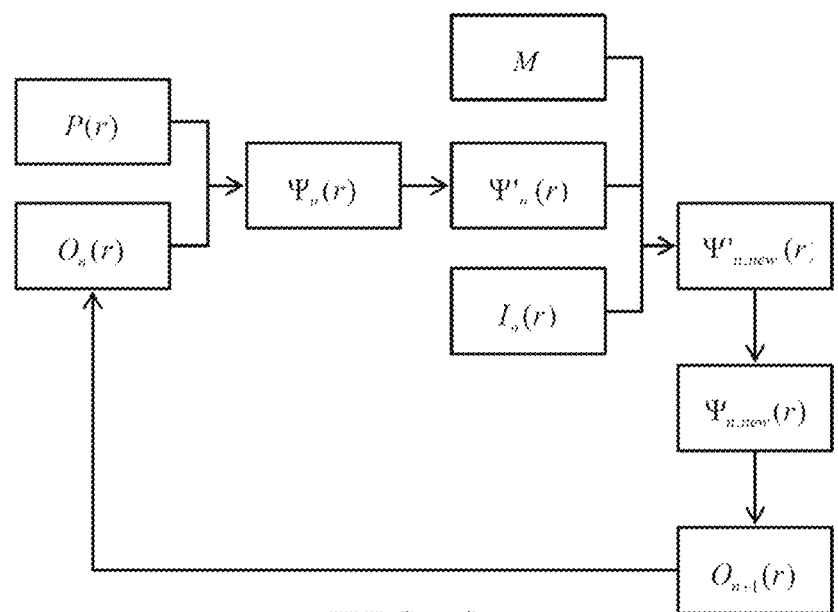
FIG. 3 is a flowchart showing steps of an imaging method—a hollow ptychography algorithm of the present invention.

Referring to FIG. 3, the method includes the following steps:

setting P(r) as a probe function, where the probe function is an incident wave function before the charged particle beam arrives at the sample, and r is a spatial coordinate;

setting O(r) as a complex amplitude distribution function of an object, where the complex amplitude distribution function of the object can reflect the structure and characteristics of the object sufficiently, the value of the complex amplitude distribution function of the object represents the effect of a characteristic position of the sample on a charged particle beam that passes through the sample (specifically embodied as changes in amplitude and phase), and O(r) is a target function and complex function; reconstructing O(r) through a plurality of iterative calculations by the method of this example; and using O(r), which is obtained by a last iterative calculation, as the complex amplitude distribution function of the object, where r is a space coordinate, $O_n(r)$ represents a target function in the $n^{th}$ iteration, the value of $O_n(r)$ also varies over time throughout the process of iteration, and a finally reconstructed image is obtained by plotting the amplitudes and the phases of $O_n(r)$;

setting $\Psi_{n,m}$ as a function of an exit wave penetrating the object, defining the function $\Psi_{n,m}$ of the emergent wave penetrating the object as a product of the probe function P(r) and the complex amplitude distribution function O(r) of the object:

$$\Psi_{n,m}(r) = P(r) \cdot O_n(r + R_m) \quad \text{Formula (1), where}$$

n represents the $n^{th}$ iteration of O(r), m represents the $m^{th}$ scanning position of the charged particle beam on the sample, and $R_m$ represents a relative coordinate vector of the charged particle beam in the $m^{th}$ scanning position on the sample relative to a first scanning position;

obtaining amplitude and phase distributions of the exit wave function $\Psi_{n,m}$ in a far field by performing Fourier transform on the function $\Psi_{n,m}$ of the exit wave penetrating the object, to obtain $$\Psi_{n,m}'(r) = FFT\{\Psi_{n,m}(r)\} = |A_{n,m}| \exp(i\Phi_{n,m}) \quad \text{Formula (2), where}$$

$|A_{n,m}|$ represents an amplitude of the exit wave function $\Psi_{n,m}$ in a far field in the $n^{th}$ iteration, $\Phi_{n,m}$ represents a phase of the emergent wave function $\Psi_{n,m}$ in the far field in the $n^{th}$ iteration, and i is an imaginary unit; and the exit wave function is usually expressed in a complex form, properties of the charged particle beam may be described by a wave function, which includes a real part and an imaginary part that may be expressed by a phase and an amplitude of the wave function, so that $|\Psi(r)|^2$ corresponds to the strength of a charged particle beam in a position (r) in space, which may be measured actually, and a far-field light intensity of the charged particle beam in the $m^{th}$ scanning position on the sample is collected through an experimental device and is recorded as $I_m$;

setting a constraint function M, where the function M is related to a shape of the detection module in the above imaging system. The constraint function M is a real function, the same as the diffraction pattern (D) in space size, and is also a function of the spatial coordinate. The value of the function is used to control weights of signals of different spatial coordinates on the diffraction pattern (D) in the process of iteration. Specifically, in an experiment, the value of function M is related to a specific structure and shape of the detection module;

substituting $\sqrt{I_m}$ for the amplitude $|A_{n,m}|$ of the emergent wave function $\Psi_{n,m}$ in the far field and substituting into the constraint function M so as to obtain Formula (3):

$$\Psi_{n,m,new}'(r)= \sqrt{I_m}\exp(i\Phi_{n,m})\times M+|A_{n,m}|\exp(i\Phi_{n,m})\times(1-M) \quad \text{Formula (3)}$$

obtaining a new exit wave function $\Psi_{n,m,new}$ by performing inverse fast Fourier transform on $\Psi_{n,m,new}'(r)$, which is shown by Formula (4):

$$\Psi_{n,m,new}(r)=FFT^{-1}\{\Psi_{n,m,new}'(r)\} \quad \text{Formula (4)}$$

obtaining, through calculation, a new complex amplitude distribution function of the object according to the new exit wave function $\Psi_{n,m,new}(r)$, which is shown by Formula (5):

$$O_{n+1}(r+R_m) = O_n(r+R_m) + \beta \frac{P(r)}{P(r)+\alpha} \times [\Psi_{n,m,new}(r) - \Psi_{n,m}(r)], \quad \text{Formula (5)}$$

where $\alpha$ and $\beta$ are adjustable parameters, $\alpha$ is used to ensure that a denominator is not 0, and $\beta$ is used to control the strength fed back; and after the new complex amplitude distribution function of the object is obtained through calculation via Formula (1)-Formula (5), re-substituting the new complex amplitude distribution function $O_{n+1}(r+R_m)$ of the object into the Formula (1) to start another iterative calculation, and using a complex amplitude distribution function $O_z(r+R_m)$ of the object, which is obtained by a final iterative calculation, as the basis of reconstructing an image, so that the reconstructed image is obtained by plotting amplitudes and phases of $O_{n+1}(r+R_m)$.

Example 5

Based on Example 4, in an imaging method of this example, the constraint function M is related to the structure of the detection module 5.

In discretized conditions, the constraint function M is represented by a matrix function, each element value in the matrix function corresponds to a dependent variable, a function value of the dependent variable is 1 or 0, and an independent variable is a corresponding two-dimensional position coordinate.

In addition, in calculations of a simulation program, the constraint function M is represented by a matrix function directly, the matrix function is related to the structure of the detection module 5, position coordinates in the matrix function correspond to position coordinates of the detection module 5, and position coordinates in the matrix function with a dependent variable function value being 1 correspond to position coordinates of the hole 8 on the detection module 5.

In the simulation program, the matrix function corresponds to an image, position coordinates in the matrix function with a dependent variable function value being 1 are all displayed as white in the image, and position coordinates in the matrix function with a dependent variable function value being 0 are all displayed as black in the image, so that an area displayed in white in the image corresponding to the matrix function M corresponds to the position of the hole on the detection module 5.

Example 6

Based on Example 5, in an imaging method of this example, in the first iteration of O(r), an initial complex amplitude distribution function $O_0(r+R_m)$ of the object has a random distribution. A product of the initial complex amplitude distribution function $O_0(r+R_m)$ of the object and a probe function P(r) is used as the function $\Psi_{n,m}$ of the exit wave penetrating the object: $\Psi_{n,m}(r)=P(r)\cdot O_0(r+R_m)$.

Example 7

Based on Example 5, in an imaging method of this example, in the first iteration of O(r), when there are other priori conditions, the initial complex amplitude distribution) function $O_0(r+R_m)$ of the object may be used to obtain a low-resolution image of the sample by other means, and it is expected to obtain a high-resolution image based on the low-resolution image. In this case, the low-resolution image is used as the initial complex amplitude distribution function $O_0(r+R_m)$ of O(r) directly.

Example 8

Based on Example 5, in an imaging method of this example, the charged particle beams converge onto the sample. After sample scanning, most of the charged particle beams arrive at the detection module, but there are still charged particle beams passing through the hole 8 of the detection module. The signal strength of the charged particle beams passing through the hole 8 of the detection module is not detected by the detection module, resulting in the absence of a corresponding diffraction pattern. As a compensation, the radian of the hole 8 disposed on the detection module 5, that is, a collection angle for collecting diffraction patterns, is 5 mrad-22 mrad. In this case, the charged particle beams may scan the sample continuously, each scanning area may overlap with a plurality of other areas to some extent, and an absent diffraction pattern may be obtained again in a subsequent scanning position. The middle of the hole 8 is sufficiently small, and its boundary is sufficiently large. With such conditions satisfied, a complete reconstruction result can be obtained by using the detection module having the hole without degrading imaging quality.

Example 9

Figure 4:
FIG. 4 is information about an experimental original picture.
Figure 5:
FIG. 5 is information about a reconstructed area in the experimental original picture.

Based on Example 8, in an imaging method of the example, the feasibility of the algorithm is verified by using FIG. 4 as the diffraction pattern acquired by the detection module 5. Original phase and amplitude information is included in the diffraction pattern, with the image resolution of 256*256. A partial area of the image (referring to FIG. 5) is reconstructed by using the hollow ptychography method. The number of scanning points on the reconstructed area is 8100 (90*90), and its diffraction pattern has a collection angle of 22 mrad.

A computer-simulated detector obtains the resolution of the diffraction pattern, 512*512, in each scanning point.

Adjustable parameters α and β are used to control the magnitude of change of the target function for the number of times of iteration, are parameters that can be set freely, and has typical values of 0.1-0.01. In this example, the parameters are selected as α=0.01 and β=0.01.

Figure 6:
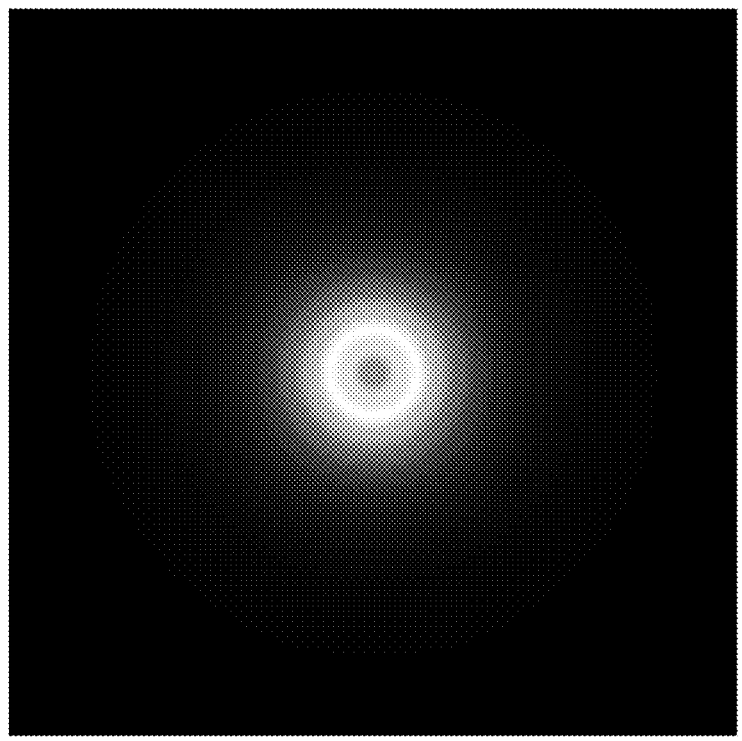
FIG. 6 is an amplitude image of an initial function P(r) in Example 9.
Figure 7:
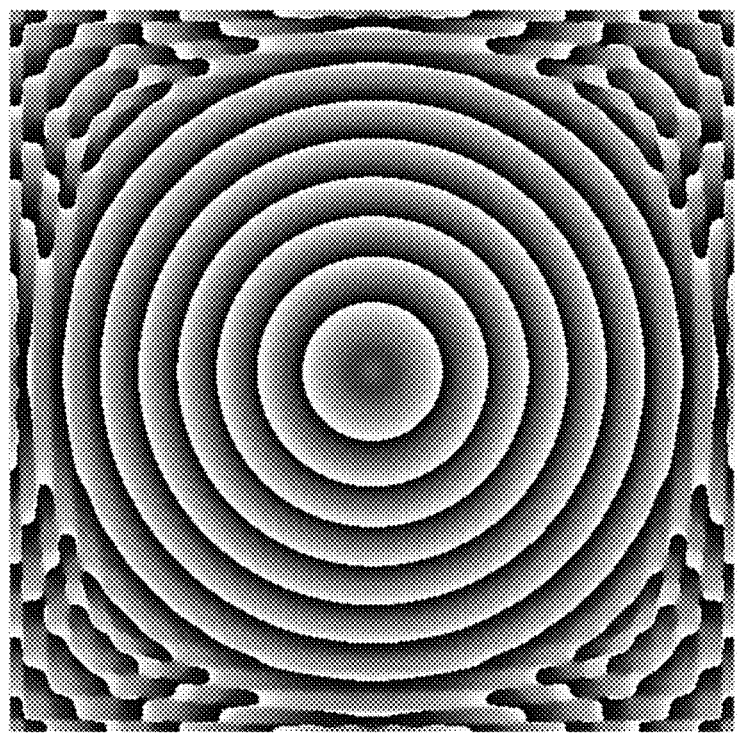
FIG. 7 is a phase image of the initial function P(r) in Example 9.

The function P(r) is a two-dimensional complex function in which a position on a plane is taken as a variable, and its form is not unique. In the ptychography algorithm, the function P(r) remains unchanged in iterations, and this example is simulated by a computer without changing P(r). Images of the function P(r) used in this example are shown in FIG. 6 and FIG. 7. FIG. 6 is an amplitude image of the function P(r), and FIG. 7 is a phase image of the function P(r).

Figure 8:
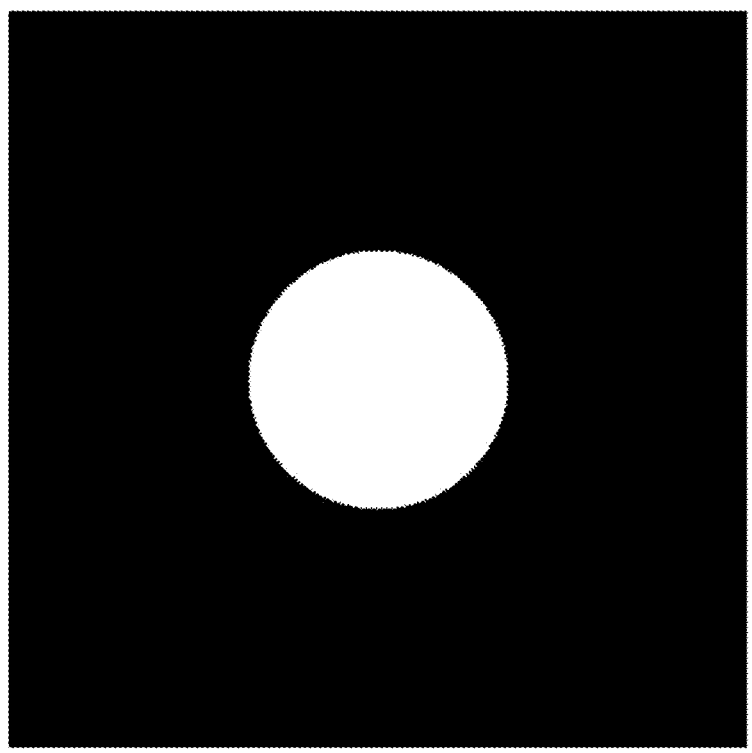
FIG. 8 is an image of a function M in Example 9.

In an actual experiment, function M depends on the structure and shape of the detection module, and reconstruction may be performed with different functions M in a computer simulation manner. The function M is a two-dimensional (planar) real function, and usually, its size (pixel resolution) on the plane is the same as the actual physical (pixel) resolution of the detection module. In this example, the pixel resolution of function M is 512*512. The function M in this example is characterized in that its value is 1 in a circular area with a central radius of 91 pixels, which is represented by white, and its value is 0 in other areas, which is represented by black. A hole disposed on a corresponding detection module is of a circular shape, and a collection angle for acquiring a diffraction pattern is 22 mrad. That is, the value of the function is 1 in an area in which a divergence angle of a charged particle beam along an optical axis is 22 mrad, and the value of the function is 0 in the remaining areas. An image corresponding to function M (matrix function) used is shown in FIG. 8 below.

Figure 9:
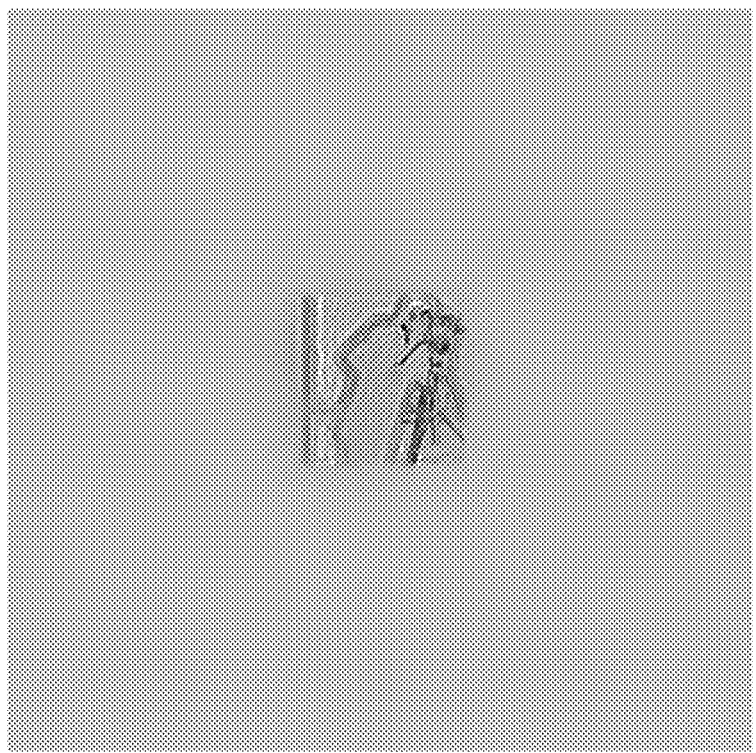
FIG. 9 is an amplitude image of a reconstructed image in Example 9.
Figure 10:
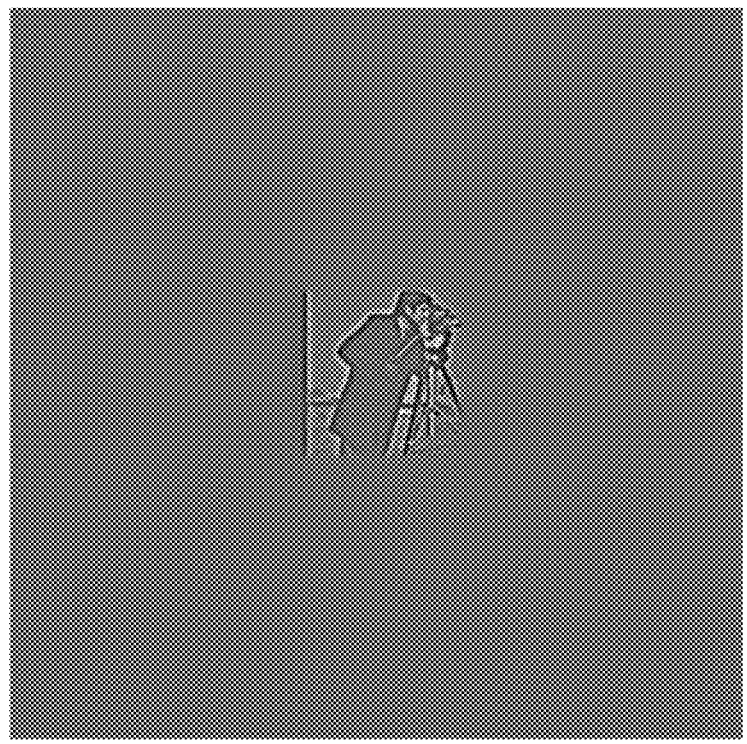
FIG. 10 is a phase image of the reconstructed image in Example 9.

In this example, the number of cycles of running an iteration is 10. An amplitude image of a finally reconstructed image obtained through computer simulation is shown in FIG. 9, and a reconstructed phase image is shown in FIG. 10.

Example 10

Figure 11:
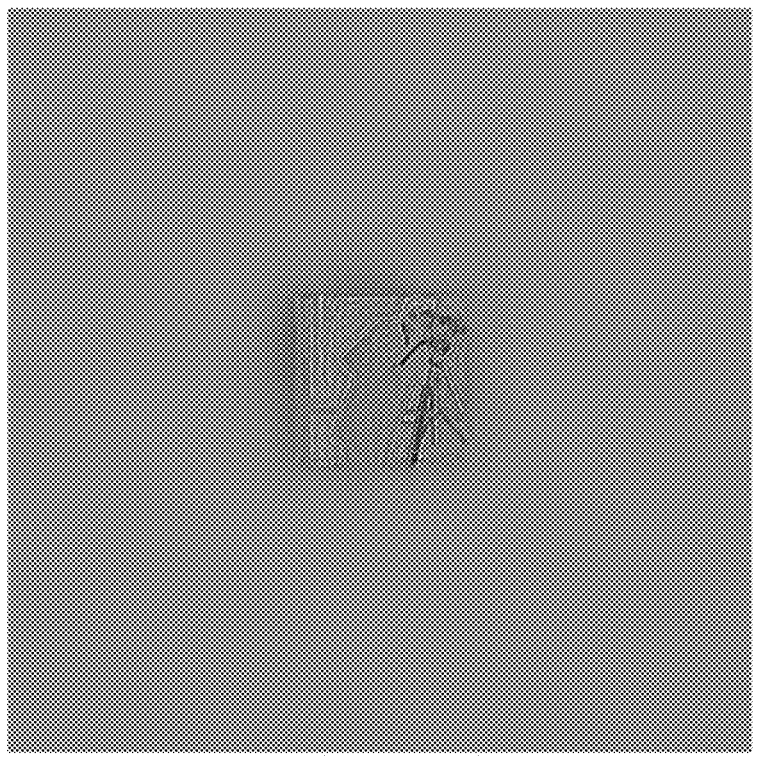
FIG. 11 is an amplitude image of a reconstructed image in Example 10.
Figure 12:
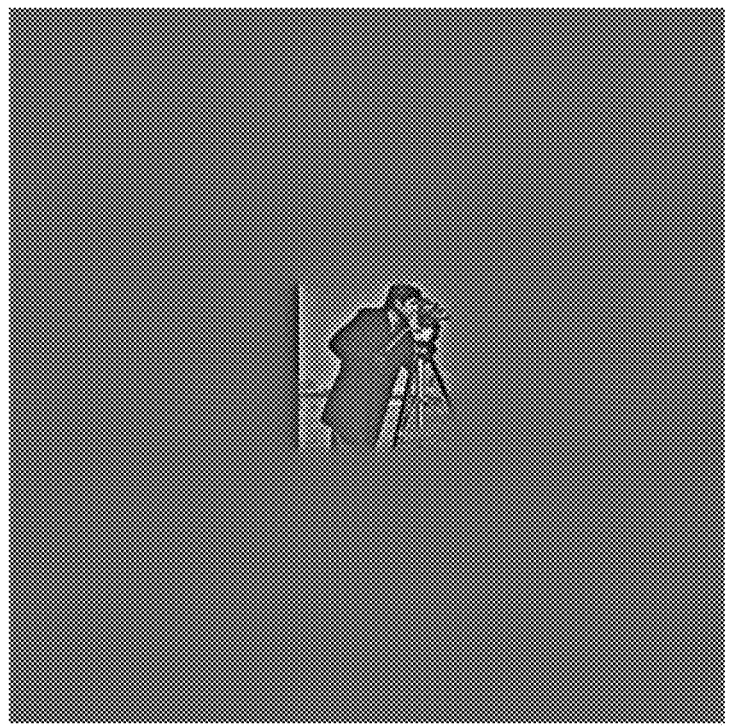
FIG. 12 is a phase image of the reconstructed image in Example 10.

Based on Example 9, in this example, except that the number of cycles of running iterations is 50, other parameter conditions are the same as those in Example 9 and are used to experiment with image reconstruction. Results of the image reconstruction are shown in FIG. 11 and FIG. 12. FIG. 11 is an amplitude image of a reconstructed image, and FIG. 12 is a reconstructed phase image.

Example 11

Figure 13:
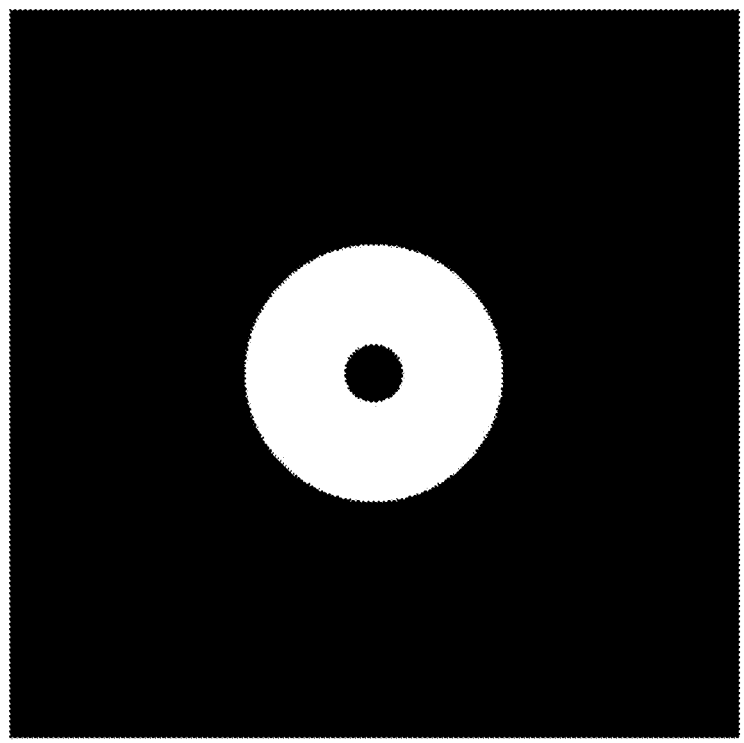
FIG. 13 is an image of a function M in Example 11.

Based on Example 9, in this example, the number of cycles of running iterations is 50. The function M is characterized in that its value is 1 in an area with a central inner radius of 20 pixels and an outer radius of 90 pixels, which is represented by white, and its value is 0 in the remaining areas, which represented by black. Referring to FIG. 13, a hole disposed on a corresponding detection module is an annular hole, and an annular ring portion is equivalent to a divergence angle of 5 mrad-22 mrad.

Figure 14:
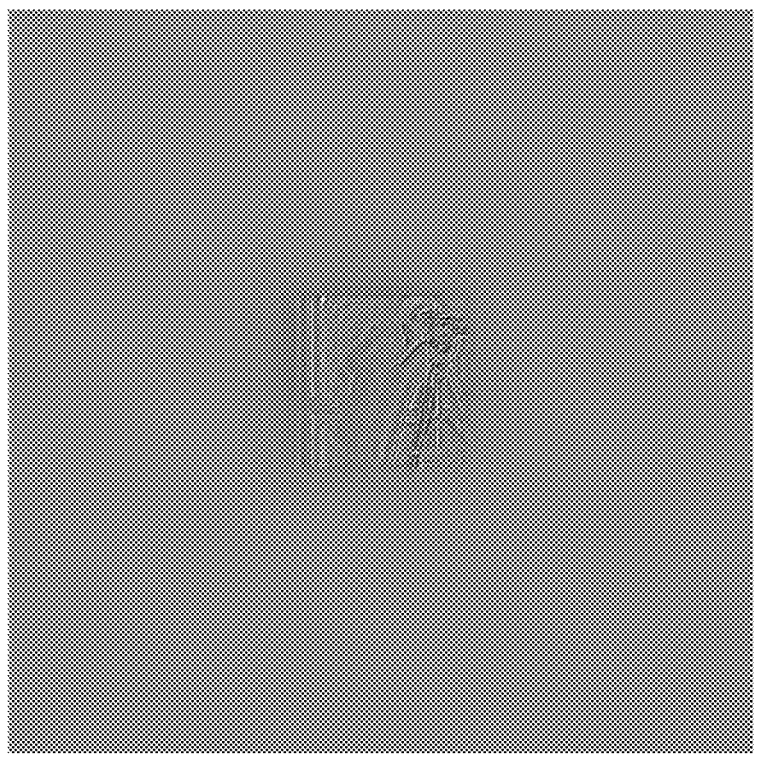
FIG. 14 is an amplitude image of a reconstructed image in Example 11.
Figure 15:
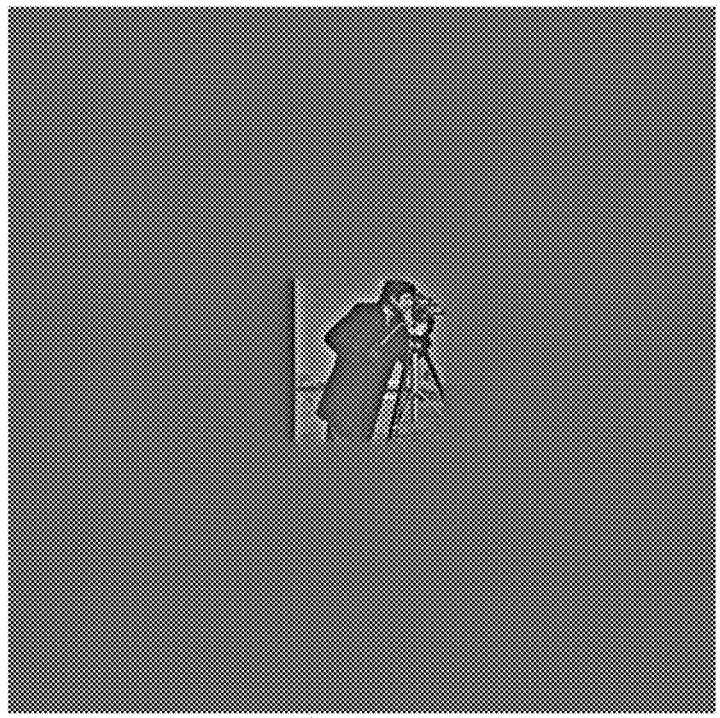
FIG. 15 is a phase image of the reconstructed image in Example 11.

Other parameter conditions are the same as those in Example 6 and are used to experiment with image reconstruction. Results of the image reconstruction are shown in FIG. 14 and FIG. 15. FIG. 14 is an amplitude image of a reconstructed image, and FIG. 15 is a reconstructed phase image.

Example 12

Figure 16:
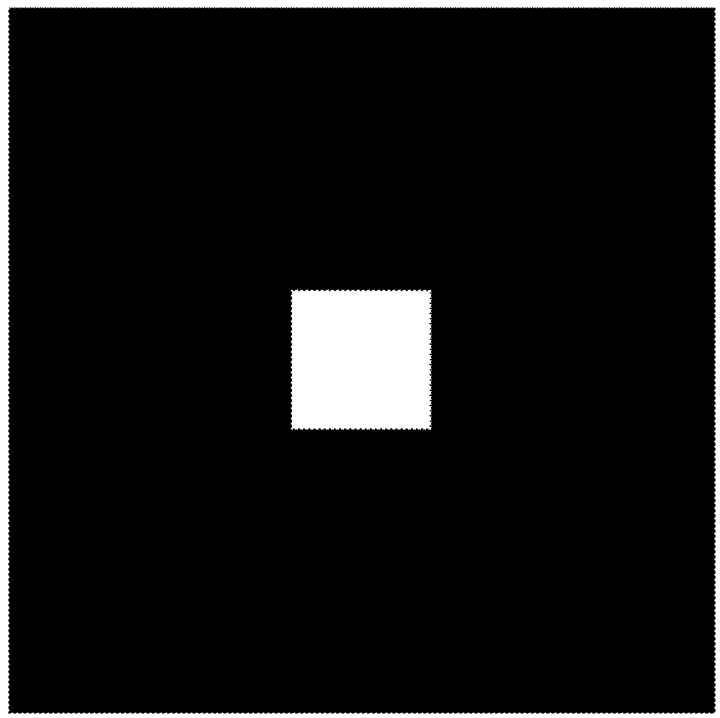
FIG. 16 is an image of a function M in Example 12.
Figure 17:
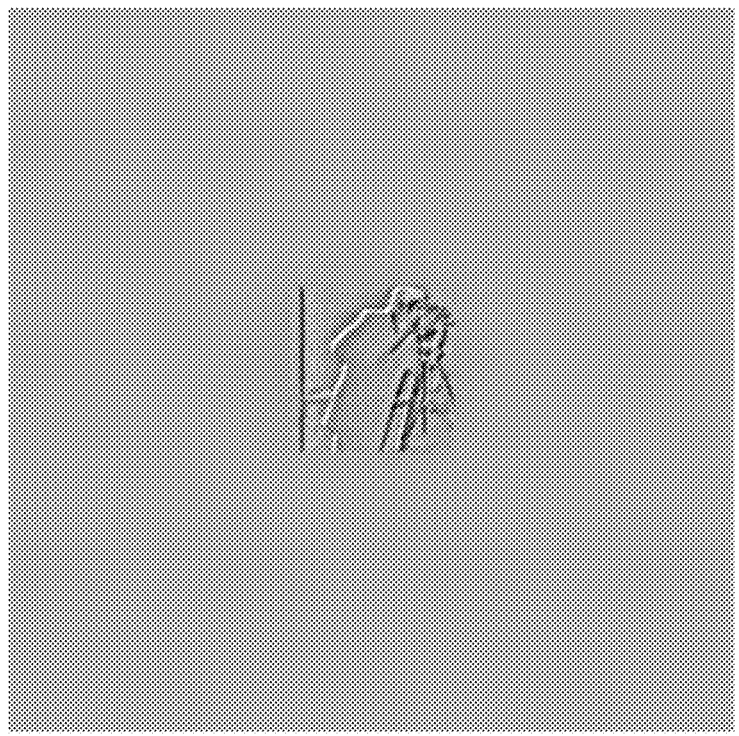
FIG. 17 is an amplitude image of a reconstructed image in Example 12.
Figure 18:
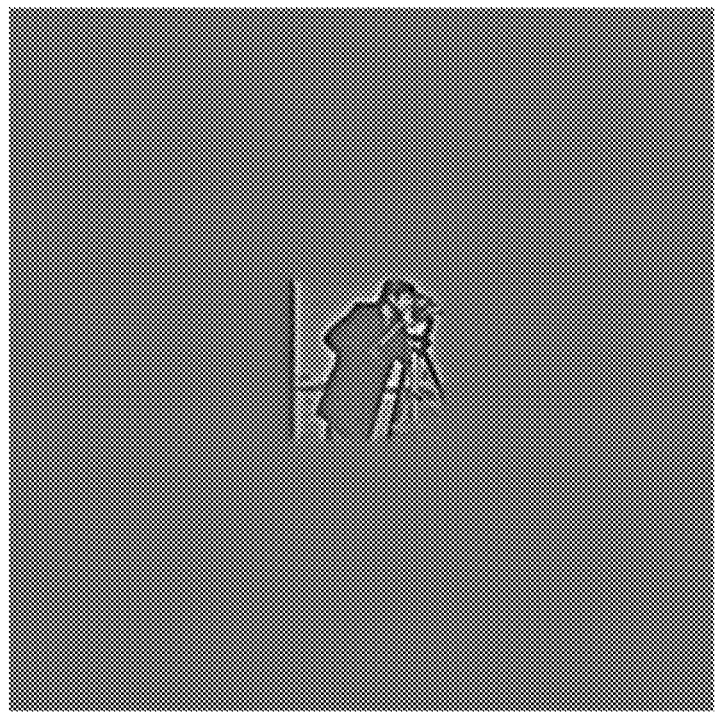
FIG. 18 is a phase image of the reconstructed image in Example 12.

Based on Example 9, in this example, the number of cycles of running iterations is 50. The function M is characterized by being of 1 in a central square area with a side length of 100 pixels, which is represented by white, and being of 0 in the remaining areas, which is represented by black. Referring to FIG. 16, a hole disposed on a corresponding detection module is a square hole. Other parameter conditions are the same as those in Example 6 and are used to experiment with image reconstruction. Results of the image reconstruction are shown in FIG. 17 and FIG. 18. FIG. 17 is an amplitude image of a reconstructed image, and FIG. 18 is a reconstructed phase image.

Example 13

An imaging system is provided. The system includes an imaging device and an imaging method. The imaging method uses a hollow ptychography algorithm, and the imaging device uses an imaging device provided with a hole. At least one diffraction pattern is acquired first by using the imaging device provided with the hole, and then, the at least one diffraction pattern is processed by using the hollow ptychography method, so that a ptychography image is obtained.

The foregoing descriptions are merely preferred implementations of the present invention. It should be noted that various improvements and refinements can be made without departing from the principle of the present invention for a person skilled in the art, and those improvements and refinements shall also fall within the protection scope of the present invention.

What is claimed is:

1. An imaging device, comprising:
   a charged particle source (1), configured to emit a charged particle beam;
   a convergence system (2), configured to constrain and converge the charged particle beam;
   a scanning control system (3), configured to control the charged particle beam to scan a sample;
   the sample (4);
   a detection module (5), configured to receive the charged particle beam and detect a signal strength of the charged particle beam to acquire at least one diffraction pattern; and
   a spectral analysis module (6) disposed below the detection module (5), configured to analyze spectroscopic characteristics of the charged particle beam to acquire spectral data,
   wherein the detection module (5) comprises a plurality of pixelated detector units (7) and the detection module (5) is provided with a hole (8) thereon,
   wherein the imaging device performs hollow ptychography on the at least one diffraction pattern based on a hollow ptychography algorithm to reconstruct an image, and
   wherein the reconstructed image is obtained through computer calculation.

2. The imaging device according to claim 1, wherein the hole (8) is of, but not limited to, a circular, square, or annular shape.

3. The imaging device according to claim 1, wherein the detection module (5) is of, but is not limited to, a square shape, a circular shape, and an island shape.

4. The imaging device according to claim 2, wherein the detection module (5) is of, but is not limited to, a square shape, a circular shape, and an island shape.

5. The imaging device according to claim 1, wherein the imaging device acquires the at least one diffraction pattern by performing the following steps:

A: converging, onto the sample (4) by the convergence system (2), the charged particle beam emitted by the charged particle source (1);

B: controlling, by the scanning control system (3), the charged particle beam to scan the sample (4);

C: the charged particle beam penetrating the sample (4) to arrive at the detection module (5), detecting the signal strength of the charged particle beam in a corresponding scanning position by the pixelated detector unit (7) in the detection module (5), and acquiring a diffraction pattern in the corresponding scanning position; and D: the charged particle beam scanning the sample (4), enabling a non-empty set $R_{overlap}$ to be present between a scanning area $R_i$ corresponding to a scanning beam spot and other scanning areas $R_j$ wherein $R_{overlap} = R_i \cap R_j (i \leq N, j \leq N)$, and N is the total number of scanning areas of the charged particle beam on the sample (4).

6. The imaging device according to claim 1, wherein the performing the hollow ptychography on the at least one diffraction pattern based on the hollow ptychography algorithm particularly comprises the following steps:

a: setting P(r) as a probe function and O(r) as a complex amplitude distribution function of an object, reconstructing O(r) through a plurality of iterative calculations, using O(r), which is reconstructed through a final iterative calculation, as a final complex amplitude distribution function of the object, and reconstructing the image through the hollow ptychography based on the final complex amplitude distribution function of the object;

b: setting $\Psi_{n,m}$ as a function of an exit wave penetrating the object, and defining $\Psi_{n,m}$ as a product of the probe function (P)r and the complex amplitude distribution function O(r) of the object, to obtain $$\Psi_{n,m}(r) = P(r) \cdot O_n(r+R_m) \quad \text{formula (1)}$$

wherein n represents the $n^{th}$ iteration of O(r), m represents the $m^{th}$ scanning position of the charged particle beam on the sample, $R_m$ represents a relative coordinate vector of the charged particle beam in the $M^{th}$ scanning position on the sample relative to a first scanning position, and r is a space coordinate;

c: obtaining amplitude and phase distributions of the exit wave function $\Psi_{n,m}$ in a far field by performing Fourier transform on the function $\Psi_{n,m}$ of the exit wave penetrating the object, to obtain $$\Psi_{n,m}' = \text{FFT}\{\Psi_{n,m}(r)\} = |A_{n,m}| \exp(i\Phi_{n,m}) \quad \text{formula (2),}$$

wherein $|A_{n,m}|$ represents an amplitude of the exit wave function $\Psi_{n,m}$ in the far field; and $\Phi_{n,m}$ represents a phase of the exit wave function $\Psi_{n,m}$, in the far field;

d: collecting, by using an experimental device, a far-field light intensity of an exit wave penetrating the sample, and recording the same $I_m$, wherein $I_m$ represents the far-field light intensity of the exit wave penetrating the sample after the charged particle beam scans the $m^{th}$ scanning position on the sample;

e: setting a constraint function M;

f: substituting $\sqrt{I_m}$ for the amplitude $|A_{n,m}|$ of the exit wave function $\Psi_{n,m}$ in the far field and substituting into the constraint function M so as to obtain formula (3):

$$\Psi_{n,m,new}'(r) = \sqrt{I_m}\exp(i\Phi_{n,m}) \times M + |A_{n,m}|\exp(i\Phi_{n,m}) \times (1-M) \quad \text{formula (3)}$$

g: obtaining a new exit wave function $\Psi_{n,m,new}(r)$ by performing inverse Fourier transform on $\Psi_{n,m,new}'(r)$, which is shown by formula (4):

$$\Psi_{n,m,new}(r) = \text{FFT}^{-1}\{\Psi_{n,m,new}'(r)\} \quad \text{formula (4)}$$

h: obtaining, through calculation, a new complex amplitude distribution function of the object according to the new exit wave function $\Psi_{n,m,new}(r)$, which is shown by formula (5):

$$O_{n+1}(r+R_m) = O_n(r+R_m) + \beta \frac{P(r)}{P(r)+\alpha} \times [\Psi_{n,m,new}(r) - \Psi_{n,m}(r)], \quad \text{formula (5)}$$

wherein $\alpha$ and $\beta$ are adjustable parameters, $\alpha$ is used to ensure that a denominator is not 0, and $\beta$ is used to control the strength fed back;

i: substituting the new complex amplitude distribution function $O_{n+1}(r+R_m)$ of the object into the formula (1) to start another iterative calculation; and j: using a complex amplitude distribution function $O_z(r+R_m)$ of the object, which is obtained through the final iterative calculation, as the basis of reconstructing the image, and obtaining the reconstructed image by plotting amplitudes and phases of $O_{n+1}(r+R_m)$.

7. The imaging device according to claim 5, wherein the performing the hollow ptychography on the at least one diffraction pattern based on the hollow ptychography algorithm particularly comprises the following steps:

a: setting P(r) as a probe function O(r) and as a complex amplitude distribution function of an object, reconstructing through a plurality of iterative calculations, using O(r), which is reconstructed through a final iterative calculation, as a final complex amplitude distribution function of the object, and reconstructing the image through the hollow ptychography based on the final complex amplitude distribution function of the object;

b: setting $\Psi_{n,m}$ as a function of an exit wave penetrating the object, and defining $\Psi_{n,m}$ as a product of the probe function P(r) and the complex amplitude distribution function O(r) of the object, to obtain $$\Psi_{n,m}(r) = P(r) \cdot O_n(r+R_m) \quad \text{formula (1),}$$

wherein n represents the $n^{th}$ iteration of O(r), m represents the $m^{th}$ scanning position of the charged particle beam on the sample, $R_m$ represents a relative coordinate vector of the charged particle beam in the $m^{th}$ scanning position on the sample relative to a first scanning position, and r is a space coordinate;

c: obtaining amplitude and phase distributions of the exit wave function $\Psi_{n,m}$ in a far field by performing Fourier transform on the function $\Psi_{n,m}$ of the exit wave penetrating the object, to obtain $$\Psi_{n,m}'(r) = \text{FFT}\{\Psi_{n,m}(r)\} = |A_{n,m}|\exp(i\Phi_{n,m}) \quad \text{formula (2), wherein}$$

$|A_{n,m}|$ represents an amplitude of the exit wave function in the far field $\Psi_{n,m}$; and $\Phi_{n,m}$ represents a phase of the exit wave function in the far field $\Psi_{n,m}$;

d: collecting, by using an experimental device, a far-field light intensity of an exit wave penetrating the sample, and recording the same as $I_m$, wherein $I_m$ represents the far-field light intensity of the exit wave penetrating the sample after the charged particle beam scans the $m^{th}$ scanning position on the sample;

e: setting a constraint function M;

f: substituting $\sqrt{I_m}$ for the amplitude $|A_{n,m}|$ of the exit wave function $\Psi_{n,m}$ in the far field and substituting into the constraint function M so as to obtain formula (3):

$$\Psi_{n,m,new}'(r) = \sqrt{I_m}\exp(i\Phi_{n,m}) \times M + |A_{n,m}|\exp(i\Phi_{n,m}) \times (1-M) \quad \text{formula (3)}$$

g: obtaining a new exit wave function $\Psi_{n,m,new}(r)$ by performing inverse Fourier transform on $\Psi_{n,m,new}'(r)$, which is shown by formula (4):

$$\Psi_{n,m,new}(r) = FFT^{-1}\{_{n,m,new}(r)\} \quad \text{formula (4)}$$

h: obtaining, through calculation, a new complex amplitude distribution function of the object according to the new exit wave function $\Psi_{n,m,new}(r)$, which is shown by formula (5):

$$O_{n+1}(r+R_m) = O_n(r+R_m) + \beta \frac{P(r)}{P(r)+\alpha} \times [\Psi_{n,m,new}(r) - \Psi_{n,m}(r)], \quad \text{formula (5)}$$

wherein

α and β are adjustable parameters, α is used to ensure that a denominator is not 0, and β is used to control the strength fed back;

i: substituting the new complex amplitude distribution function $O_{n+1}(r+R_m)$ of the object into the formula (1) to start another iterative calculation; and j: using a complex amplitude distribution function $O_z(r+R_m)$ of the object, which is obtained through the final iterative calculation, as the basis of reconstructing the image, and obtaining the reconstructed image by plotting amplitudes and phases of $O_{n+1}(r+R_m)$.

8. The imaging device according to claim 6, wherein the constraint function M is related to a structure of the detection module (5).

9. The imaging device according to claim 7, wherein the constraint function M is related to a structure of the detection module (5).

10. The imaging device according to claim 8, wherein in the first iteration of O(r), a complex amplitude distribution function $O_0(r+R_m)$ of the object is set as a random distribution function.

11. The imaging device according to claim 9, wherein in the first iteration O(r), of a complex amplitude distribution function $O_0(r+R_m)$ of the object is set as a random distribution function.

12. An imaging system, comprising the imaging device according to claim 1.

\* \* \* \* \*